United States Patent [19]
Chen

[11] Patent Number: 5,913,135
[45] Date of Patent: Jun. 15, 1999

[54] METHOD FOR FORMING PLANAR FIELD EFFECT TRANSISTORS WITH SOURCE AND DRAIN ON OXIDE AND DEVICE CONSTRUCTED THEREFROM

[75] Inventor: Ih-Chin Chen, Richardson, Tex.

[73] Assignee: Texas Instruments Incorporated, Dallas, Tex.

[21] Appl. No.: 08/989,985

[22] Filed: Dec. 12, 1997

Related U.S. Application Data

[60] Provisional application No. 60/033,480, Dec. 19, 1996.
[51] Int. Cl.$^6$ .................................................. H01L 21/20
[52] U.S. Cl. .......................................... 438/489; 438/969
[58] Field of Search .................................... 438/489, 969

[56] References Cited

U.S. PATENT DOCUMENTS

| | | | |
|---|---|---|---|
| 5,110,757 | 5/1992 | Arst et al. | 438/489 |
| 5,449,642 | 9/1995 | Tan et al. | 437/200 |

OTHER PUBLICATIONS

IEDM 1985, "A Novel MOS Device Structure With S/D Contacts Over Oxide (C00)", pp. 204–207 (C.H. Dennison, A.T. Wu. P.K. Ko, C.J. Drowley and D. Bradbury). Month Unknown.

1996 Symposium on VLSI Technology Digest of Technical Papers, "0.15μm Delta–Doped CMOS With On–Field Source/Drain Contacts", pp. 172–173 (K. Imai, C. Hu, T. Andoh, Y. Kinoshita, Y. Matsubara, T. Tatsumi and Yamazaki) Month Unknown.

Primary Examiner—John F. Niebling
Assistant Examiner—Michael S. Lebentritt
Attorney, Agent, or Firm—Jacqueline J. Garner; Wade James Brady; Richard L. Donaldson

[57] ABSTRACT

A method for forming a transistor (50) includes forming a first insulating region (16) in the outer surface of a semiconductor body (10) and forming a second insulating region (16) in the outer surface of the semiconductor body (10) and spaced apart from the first insulating region by a region of semiconductor material. The method further includes planarizing the first and second insulating regions and the region of semiconductor material to define a planar surface (17) and forming a conductive source region (34) overlying the first insulating region. The method further includes forming a conductive drain region (36) overlying the second insulating region and forming a conductive gate body (24) overlying the planar surface (17) and spaced apart from the conductive source region (34) and the conductive drain region (36).

A field effect transistor device (50) having a substrate (10) is provided. The transistor (50) includes a conductive gate body (24) and a gate insulator layer (32) having a planar outer surface adjacent to the conductive gate body and a planar inner surface (39). The transistor further includes first and second insulating regions (16) formed in the substrate. The transistor (50) also includes a conductive drain region (36) formed on the second insulating region and a conductive source region (34) formed on the first insulating region and spaced apart from the conductive gate body (24) opposite the conductive drain region (36). The conductive drain region and conductive source region define a portion of the planar inner surface (39).

12 Claims, 4 Drawing Sheets

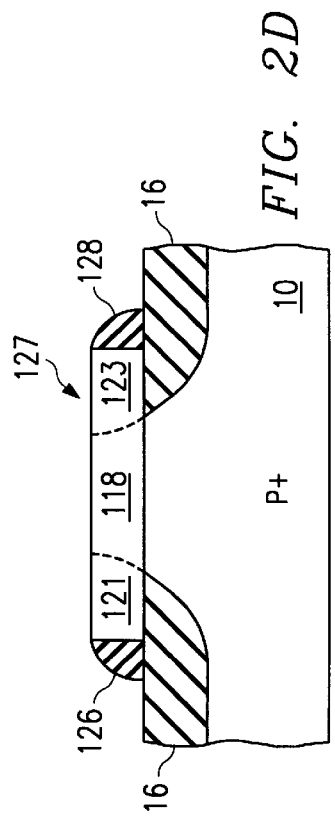
FIG. 2A
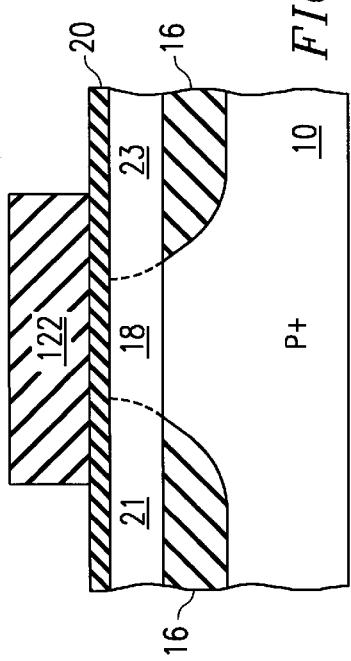
FIG. 2B
FIG. 2C
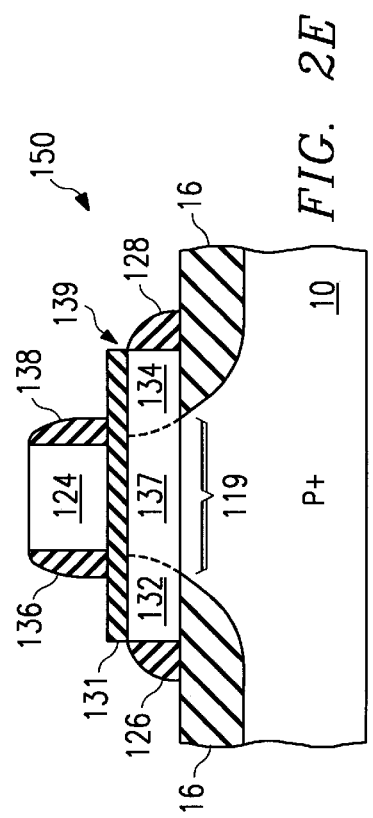
FIG. 2D
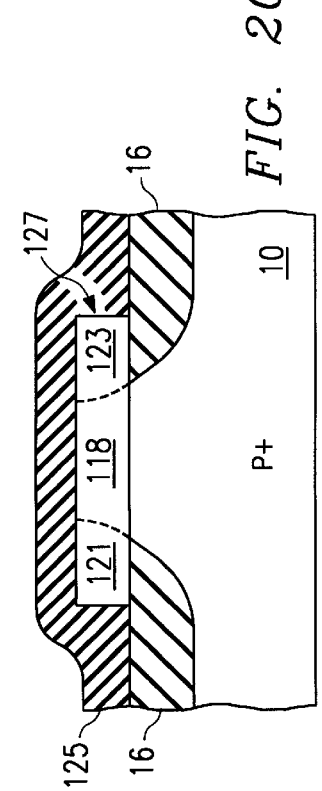
FIG. 2E

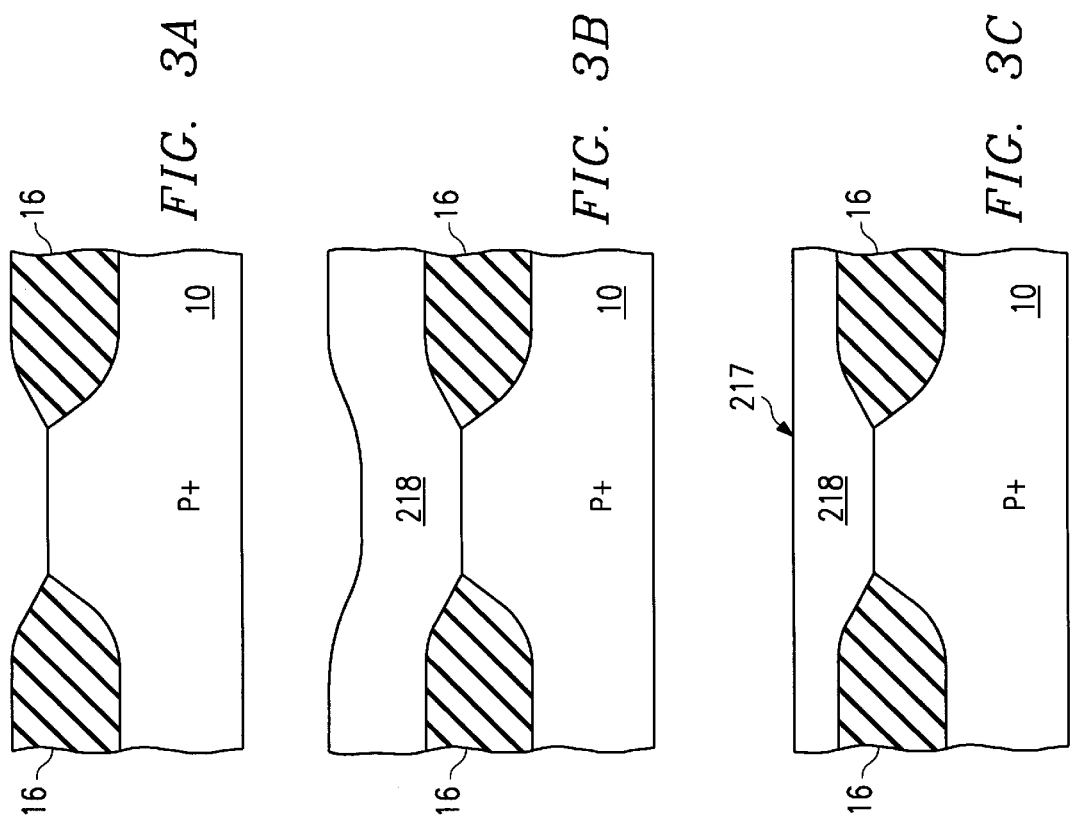

METHOD FOR FORMING PLANAR FIELD EFFECT TRANSISTORS WITH SOURCE AND DRAIN ON OXIDE AND DEVICE CONSTRUCTED THEREFROM

RELATED APPLICATIONS

This application claims priority under 35 USC § 119 (e)(1) of provisional application No. 60/033,480, filed Dec. 19, 1996.

This application is related to co-pending application Ser. No. 08/992,874, entitled Method for Forming Planar Field Effect Transistors with Source and Drain on Insulator and Device Constructed Therefrom, both applications having the same assignee.

TECHNICAL FIELD OF THE INVENTION

This invention relates in general to the field of electronic devices and more particularly to a method for forming planar field effect transistors with source and drain on oxide and device constructed therefrom.

BACKGROUND OF THE INVENTION

A field effect transistor comprises doped source and drain regions. These doped source and drain regions conventionally are formed on a substrate of a semiconductor material. A parasitic source/drain junction capacitance develops in such devices due to the junctions of the source and drain with the substrate. Junction capacitances may be undesirable because, since they must be charged before current can flow, they may slow down the field effect transistor.

In order to reduce the junction capacitance in field effect transistors occurring due to the junctions of the source and drain with the substrate, previous efforts have attempted to place an oxide region between the source and substrate and another oxide region between the drain and substrate. In one of these efforts a field effect transistor is fabricated with a minimum length between oxide regions that is approximately the same as the gate length. The use of such a technique results in a non-planar gate oxide due to the inclusion of the additional oxide regions. Non-planar gate oxide may be disadvantageous. For example, devices formed with non-planar gate oxide may suffer gate oxide integrity problems.

In another approach, a field effect transistor is fabricated with a source and drain on oxide regions with a minimum distance between oxide regions greater or significantly greater than the length of the gate. In such a technique, the oxide regions may not completely isolate the source and drain regions from the substrate. Therefore, the junction capacitance associated with these devices is only marginally better than bulk CMOS devices. Additionally, the oxide regions do not restrict the source and drain depths. Thus, short channel effects are similar to those associated with bulk CMOS devices.

SUMMARY OF THE INVENTION

Accordingly, a need has arisen for a field effect transistor with source and drain on oxide that reduces junction capacitance. In accordance with the teachings of the present invention, a field effect transistor with source and drain on oxide is provided that addresses disadvantages associated with prior systems and processing methods.

According to one embodiment of the invention, a method for forming a transistor includes forming a first insulating region in the outer surface of a semiconductor body and forming a second insulating region in the outer surface of the semiconductor body and spaced apart from the first insulating region by a region of semiconductor material. The method further includes planarizing the first and second insulating regions and the region of semiconductor material to define a planar surface and forming a conductive source region overlying the first insulating region. The method further includes forming a conductive drain region overlying the second insulating region and forming a conductive gate body overlying the planar surface and spaced apart from the conductive source region and the conductive drain region.

According to another embodiment of the invention, a field effect transistor device having a substrate is provided. The transistor includes a conductive gate body and a gate insulator layer having a planar outer surface adjacent to the conductive gate body and a planar inner surface. The transistor further includes first and second insulating regions formed in the substrate. The transistor also includes a conductive drain region formed on the second insulating region and a conductive source region formed on the first insulating region and spaced apart from the conductive gate body opposite the conductive drain region. The conductive drain region and conductive source region define a portion of the planar inner surface.

The invention provides several technical advantages. For example, the invention provides a field effect transistor that reduces the junction capacitance associated with source-substrate junctions and drain-substrate junctions. Thus, devices incorporating such field effect transistors may operate more quickly. In addition, the formation of oxide regions between the source and substrate and between the drain and substrate limits the depths of the source and drain and therefore helps prevent short channel effects. Furthermore, unlike conventional field effect transistors, the capacitance of field effect transistors according the present invention may be tailored based on design parameters by varying the thickness of oxide regions underlying the source and drain, rather than dictated by design constraints.

BRIEF DESCRIPTION OF THE DRAWINGS

A more complete understanding of the present invention may be acquired by referring to the accompanying drawings in which like reference numbers indicate like features and wherein:

FIGS. 2a through 2e are a series of schematic cross-sectional diagrams illustrating another embodiment of a field effect transistor constructed according to the teachings of the invention and the method of the invention for constructing the same; and FIGS. 3a through 3e are a series of schematic cross-sectional diagrams illustrating yet another embodiment of a field effect transistor constructed according to the teachings of the invention and the method of the invention for constructing the same.

DETAILED DESCRIPTION OF THE INVENTION

Figure 1A:
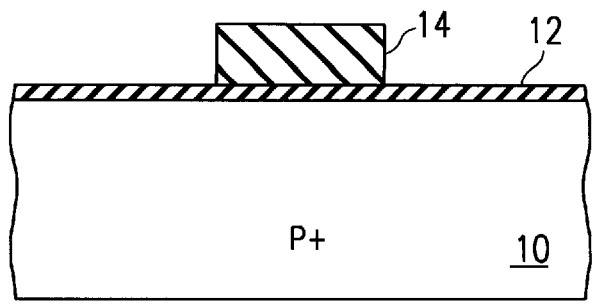
FIGS. 1a through 1h are a series of schematic cross-sectional diagrams illustrating one embodiment of a field effect transistor constructed according to the teachings of the present invention and the method of the invention for constructing the same.

FIGS. 1a through 1h illustrate the sequential processing steps that may be used to construct a planar surface on which a field effect transistor may be constructed with source and drain on oxide. Referring to FIG. 1a, a substrate 10 is doped with sufficient p-type ions such as boron to form a p+ substrate. The invention is described as formed on a p+ substrate. However it should be understood that a transistor may be formed according to the invention on a substrate doped with n-type ions to form an n+ substrate. Alternatively a field effect transistor may be formed according to the invention on a layer of suitable material that overlies a substrate. On the outer surface of substrate 10, a thin pad oxide layer 12 is deposited. Pad oxide layer 12 may alternatively be replaced with a layer of suitable material that can insulate substrate 10 from a subsequently formed nitride mask region 14. Pad oxide layer 12 may be approximately 100–200 A thick; however, other suitable thickness for pad oxide layer may be used. On the outer surface of pad oxide layer 12, a nitride layer or layer of other masking material is deposited, patterned, and etched using conventional photolithographic techniques, to form nitride mask region 14. Nitride mask region 14 provides a mask over portions of substrate 10 to prevent the unwanted growth of oxide on substrate 10.

Figure 1B:
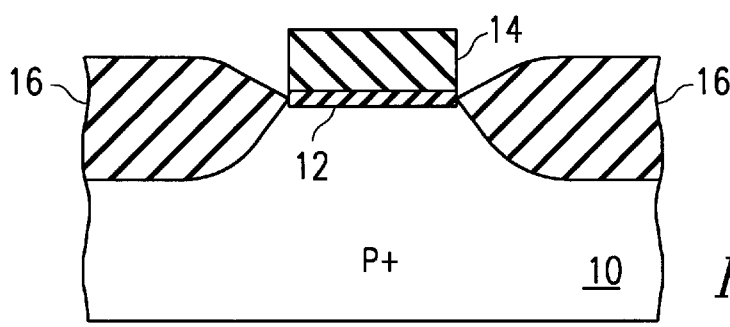

Referring to FIG. 1b, field oxide regions 16 are grown through a local oxidation of silicon (LOCOS) process. Nitride mask region 14 provides a mask enabling growth of field oxide regions 16 only at desired locations. Field oxide regions 16 provide an insulating layer between substrate 10 and subsequently formed source and drain regions, thereby reducing parasitic junction capacitance. The thickness of field oxide regions 16 may vary depending upon the desired capacitance characteristics of the resulting transistor. However, according to one embodiment, field oxide regions 16 are approximately 3000–6000 A thick measured at their greatest thickness.

Figure 1C:
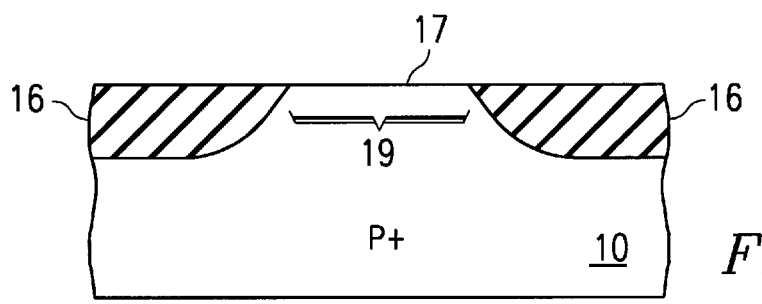

After growth of field oxide regions 16, nitride region mask region 14 is stripped. Then a planarization step is performed, resulting in outer planar surface 17 of field oxide regions 16 and substrate 10, as shown in FIG. 1c. Planarization may comprise a chemical mechanical polish (CMP); however, other planarization techniques may be used that can provide a planar outer surface 17 such as an etch back using a plasma source. Planar outer surface 17 provides a planar surface on which a field effect transistor may be formed having source and drain on oxide. The planarization step may be tailored to leave only desired portions of field oxide regions 16 on which a source and drain may be formed and to provide a desired minimum distance 19 between the two field oxide regions 16. In one embodiment, minimum distance 19 between the two field oxide regions 16 is approximately 0.1–0.2 μm; however, other lengths suitable for use with field effect transistors may be used. Planar outer surface 17 allows for the formation of gate oxide on a planar surface, which may eliminate the problems associated with non-planar gate oxide. Moreover, planar outer surface 17 provides a surface on which a field-effect transistor may be formed having a gate length approximately the same as minimum distance 19 between the two field oxide regions 16. Therefore, the source and drain may be effectively isolated from the substrate and junction capacitances may be reduced to a greater extent than reductions in junction capacitances associated with source/drain on oxide devices having a distance between oxide regions larger or significantly larger than the gate length.

Figure 1D:
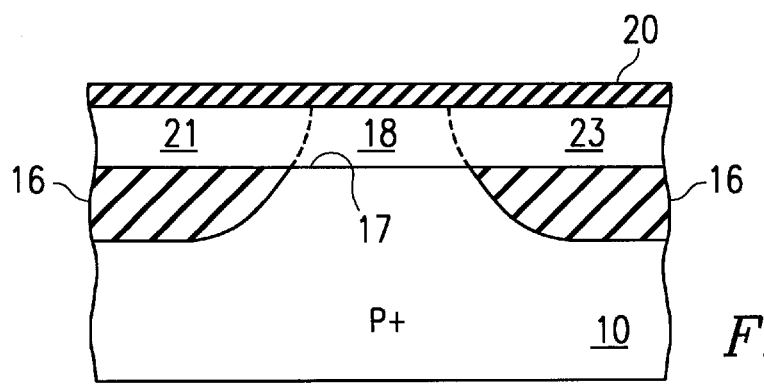

According to the steps described below, a field effect transistor having a source and a drain on oxide may be formed on outer planar surface 17 that has a planar gate oxide and possesses lower junction capacitance, which increases the switching speed of the transistor and does not suffer the gate oxide integrity problems associated with non-planar gate oxide. Referring to FIG. 1d, an epitaxial region 18 of p-type semiconductor material is grown on the outer surface of substrate 10 through a non-selective epitaxial growth process. At the same time, polysilicon regions 21 and 23 are grown on the outer surface of oxide regions 16. The non-selective epitaxial growth process will form epitaxial silicon over substrate 10 and polysilicon over oxide regions 16. Example thicknesses for epitaxial region 18 and polysilicon regions 21 and 23 include 300–1500 A; however, other suitable thicknesses may be used.

The source and drain of the field effect transistor according to the invention will be formed in polysilicon regions 21 and 23, respectively. The channel of the field effect transistor according to the invention will be in epitaxial region 18. Because the channel is in single crystalline silicon, losses in carrier mobility attributable to the use of polycrystalline silicon for the channel region may be avoided.

Figure 1E:
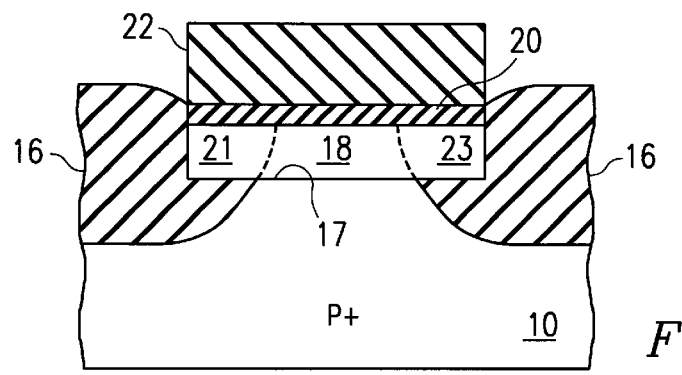
Figure 1F:
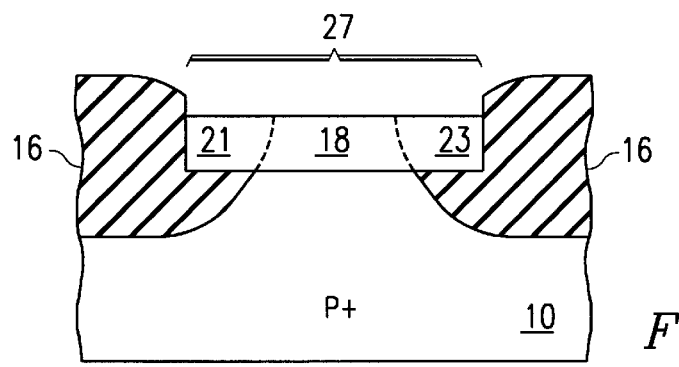

One method for defining an active region 27 for the formation of a field effect transistor according to the invention is described with reference to FIGS. 1e and 1f. Other active region definition techniques may, however, be incorporated, including the method discussed below in conjunction with FIGS. 2a through 2e. An oxide layer 20 is deposited on the outer surface of epitaxial region 18. Oxide layer 20 separates epitaxial region 18, and polysilicon regions 21 and 23 from a subsequently formed nitride mask region 22. Oxide layer 20 may be replaced with a layer of another suitable insulating material. On the outer surface of layer 20, a nitride layer is deposited, and patterned and etched using conventional photolithographic techniques, to form nitride mask region 22. Oxide layer 20 may also be etched during etching of the nitride layer. Nitride mask region 22 provides a mask over portions of epitaxial region 18 and polysilicon regions 21 and 23 to prevent the unwanted growth of oxide on epitaxial region 18 and portions of polysilicon regions 21 and 23. Field oxide regions 16 are then enlarged through a second local oxidation of silicon (LOCOS) process to isolate the resulting transistor from adjacent semiconductor devices and to define an active region 27 for the transistor, shown in FIG. 1f. Nitride region 22 and pad oxide layer 20 are then stripped, as shown in FIG. 1f. Active region 27 defines the area in which the resulting transistor will be formed.

Figure 1G:
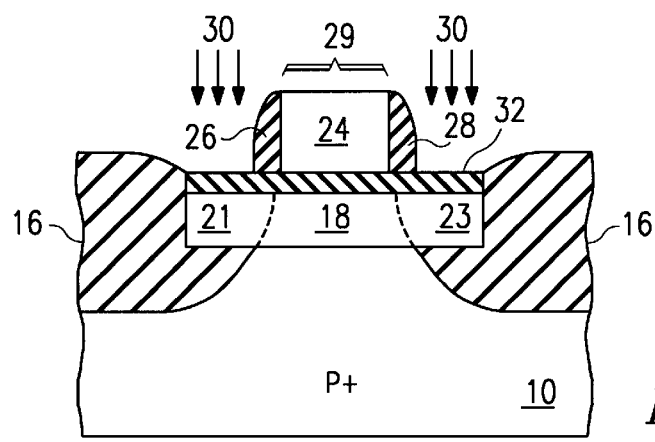
Figure 1H:
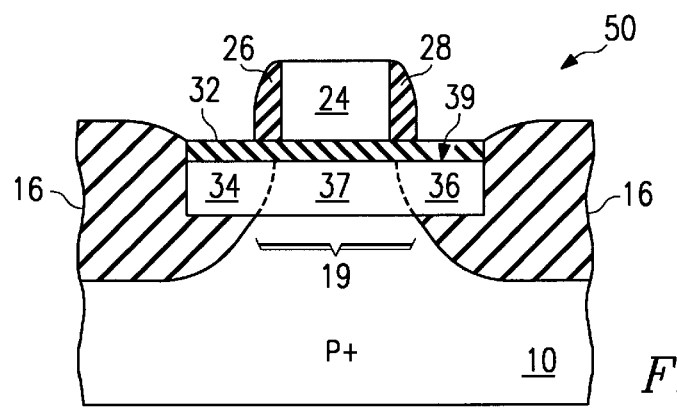

FIG. 1g illustrates several processing steps associated with forming a transistor in action region 27 and the resulting structure. Referring to FIG. 1g, a gate oxide layer 32 is grown on the outer surface of epitaxial region 18 and polysilicon regions 21 and 23. In one embodiment, gate oxide 32 may be grown to a thickness of approximately 25–100 A; however, other thicknesses for gate oxide 32 may be used. A layer of polysilicon is then deposited, patterned and etched using conventional photolithographic techniques to form polysilicon gate body 24. In one embodiment, polysilicon gate body 24 has a gate length 29 that is approximately the same or greater than the minimum distance 19 between oxide regions 16; however, gate length 29 may be shorter. Sidewalls 26 and 28 are then formed adjacent polysilicon gate body 24. Polysilicon gate body 24 may be formed, for example, by depositing an insulating material, such as oxide or nitride, using a low pressure or plasma chemical vapor deposition (CVD) technique. The insulating material is then anisotropically etched until a desired portion of gate oxide 32 is exposed. Ions are then implanted, self-aligned, in polysilicon regions 21 and 23 through gate oxide 32 to form source region 34 and drain region 36, as shown in FIG. 1h. Source region 34, drain region 36, and epitaxial region 37 define a planar outer surface 39. Subsequent processing steps may also include, for example, source, drain, a gate contact formation (not explicitly shown).

The resulting transistor 50 formed according to the invention and shown in FIG. 1h provides a field effect transistor having a source 34 and a drain 36 on field oxide 16 and therefore reduces parasitic capacitances associated with source/drain junctions with a substrate. Additionally because the gate oxide 32 is formed on a planar surface, gate oxide integrity problems will be less likely to develop. Furthermore, because the resulting structure formed according to the invention incorporates a minimum distance 19 between oxide regions 16 that is approximately the same length as gate length 29 of gate body 24, increased source/drain junction depths associated with large distances between oxide regions 16 are avoided, resulting in further isolation of source 34 and drain 36 from the substrate 10 and reducing any parasite capacitance associated with source/drain junctions with the substrate. Moreover, the capacitance of the resulting transistor 50 may be tailored based on design centers by varying the thickness of field oxide regions 16.

FIGS. 2a through 2e illustrate the sequential processing steps that may be used according to another embodiment of the invention to construct a field effect transistor with source and drain on oxide. According to the embodiment of the invention illustrated in FIGS. 2a through 2e, the processing steps for forming a field effect transistor with source and drain on oxide discussed in conjunction with FIGS. 1a through 1d may be incorporated. After the planarization step resulting in the structure illustrated in FIG. 1d, the transistor eventually formed may be isolated from adjacent semiconductor devices by the formation of a semiconductor mesa. Exemplary processing steps associated with such a procedure are discussed below.

FIG. 2a illustrates the formation of a nitride masking layer 122. On the outer surface of layer 20, a nitride layer 122 is deposited, and patterned and etched using conventional photolithographic techniques, to form nitride mask region 122. A semiconductor mesa 121 of is then formed from polysilicon regions 21 and 23 and epitaxial region 18 through an anisotropic etch, as illustrated in FIG. 2b. The nitride mask region 122 acts as a mask in the formation of semiconductor mesa 121. Nitride region 122 is then stripped, as shown in FIG. 2c, and a layer 125 of oxide is deposited over pad oxide 120 overlying mesa 121 and field oxide regions 16. Layer 125 may also be formed from nitride or other insulating materials. Layer 125 provides material that may be used to form insulating sidewalls adjacent semiconductor mesa 121.

FIG. 2d illustrates the formation of sidewalls 126 and 128 adjacent semiconductor mesa 121. Sidewalls 126 and 128 may be formed by anisotropically etching layer 125 adjacent semiconductor mesa 121 to further isolate the resulting transistor from adjacent devices. After formation of sidewalls 126 and 128, the source, drain, and gate of a resulting transistor may be formed with source and drain regions formed within semiconductor mesa 121 on top of oxide regions 16 as illustrated in FIG. 2e. The steps associated with forming the source region 132, drain region 134, and gate region 124, may include, for example, growing oxide layer 131 on the outer surface of epitaxial region 118 and polysilicon regions 121 and 123; depositing, patterning and etching a layer of polysilicon using conventional photolithographic techniques to form gate body 122; forming sidewalls 136 and 138 adjacent gate body 124; and implanting polysilicon regions 121 and 123 to form source region 132 and drain region 134. Source region 134, drain region 136, and epitaxial region 137 define a planar outer surface 139. The minimum distance 119 between oxide regions 16 is illustrated in FIG. 2E. These steps may be performed in a similar manner to that discussed above in conjunction with FIGS. 1g and 1j. Subsequent processing steps may also include, for example, source, drain, and gate contact formation (not explicitly shown).

The resulting semiconductor device 150 shown in FIG. 2e provides a transistor having the same advantages discussed above in conjunction with semiconductor device 50 and therefore provides a transistor having reduced parasitic capacitance due to source/drain junctions resulting in faster switching speeds.

FIGS. 3a through 3e are a series of schematic cross-sectional diagrams illustrating yet another embodiment of a field effect transistor constructed according to the teachings of the present invention and the method of the present invention for constructing the same. A field effect transistor with source and drain on oxide may be formed by utilizing the processing steps discussed above in conjunction with FIGS. 1a and 1b. After the formation of the structure shown in FIG. 1b, nitride mask region 14 and pad oxide 12 are stripped leaving the structure shown in FIG. 3a. In one embodiment, a semiconductor region 218 of semiconductor material is then grown on the outer surface of substrate 10 through a non-selective epitaxial growth process. The semiconductor material overlying substrate 10 is single crystalline silicon and semiconductor material overlying oxide regions 16 is polycrystalline silicon. Semiconductor region 218 may be grown to a thickness of approximately 1000 Å–2000 Å; however, other suitable thicknesses may be used. Although other thicknesses may be used, semiconductor region 218 should be thick enough to avoid exposing oxide regions 16 during a subsequent planarization step. Exposure of oxide regions 16 during a subsequent planarization step may occur due to the difficulty of ascertaining the exact thickness of semiconductor region 218 and lack of precise control during the planarization step. After formation of epitaxial region 218, a planarization step is performed, resulting in outer planar surface 217 of epitaxial region 218. The planarization step may include a chemical mechanical polish or other planarization technique that can produce planar surface 217. One examples of alternative planarization techniques is an etch back using a plasma source.

Planar surface 217 provides a planar surface on which to form a gate and gate oxide, and oxide regions 16 provide insulation between subsequently formed source and drain and therefore reduce parasitic capacitance associated with the resulting transistor. FIGS. 3d and 3e illustrate additional steps associated with forming a transistor with a source and drain on oxide. On the planar surface 217 of epitaxial region 218 an oxide layer 220 is deposited. Alternatively, oxide layer 220 may be replaced with a layer formed from an insulating material other than oxide that provides insulation between epitaxial region 218 and a subsequently formed nitride mask. On the outer surface of oxide layer 220, a nitride layer is deposited, and patterned and etched using conventional photolithographic techniques, to form nitride mask region 222. Nitride mask region 222 provides a mask over portions of epitaxial region 218 to prevent the unwanted growth of oxide on epitaxial region 218. To isolate the subsequently formed transistor from adjacent structures, a second LOCOS process is performed that enlarges oxide regions 16, as shown in FIG. 3e. Alternatively, a mesa formation such as those discussed in conjunction with FIGS. 2a through 2e or other suitable isolation techniques may be incorporated to isolate the resulting transistor from adjacent devices. After the second LOCOS process, nitride mask 222 and pad oxide 220 are stripped.

After the second LOCOS process resulting in enlarged oxide regions 16, source and drain regions can be formed in epitaxial region 218 overlying portions of oxide regions 16 and a gate body 224 having a planar gate oxide between it and epitaxial region 218 may be formed overlying planar surface 217. The steps associated with forming source region 232, drain region 234, and gate body 224 may include growing oxide layer 231 overlying on the outer surface of epitaxial region 218; depositing, patterning and etching a layer of polysilicon using conventional photolithographic techniques to form gate body 224; forming sidewalls 226 and 228; and implanting epitaxial layer 218 to form source region 232 and drain region 234. Source region 234, drain region 236, and epitaxial region 237 define a planar outer surface 239. The minimum distance 219 between oxide regions 16 is illustrated in FIG. 3E. These steps may be performed in a similar manner as discussed above in conjunction with FIGS. 1g and 1j. Subsequent processing steps may also include source, drain, a gate contact formation (not explicitly shown). The resulting semiconductor device 250 provides the same advantages discussed above in conjunction with the embodiments of the invention illustrated in FIGS. 1a through 1j and 2a through 2e.

Although the present invention has been described in detail, it should be understood that various changes, alterations, modifications and substitutions may be made to the teachings herein without departing from the spirit and scope of the present invention which is solely defined by the appended claims.

What is claimed is:

1. A method of forming a transistor comprising the steps of:
   forming a first insulating region in the outer surface of a semiconductor body;
   forming a second insulating region in the outer surface of the semiconductor body and spaced apart from the first insulating region by a region of semiconductor material;
   planarizing the first and second insulating regions and the region of semiconductor material to define a planar surface;
   forming a conductive source region overlying the first insulating region wherein the step of forming a conductive source region, a conductive drain region and a conductive gate body comprises forming a mesa of semiconductor material overlying the planar surface;
   forming a conductive drain region overlying the second insulating region; and
   forming a conductive gate body overlying the planar surface and spaced apart from the conductive source region and the conductive drain region.

2. The method of claim 1 wherein the step of forming a first insulating region and the step of forming a second insulating region comprises a LOCOS process.

3. The method of claim 1 wherein the step of planarizing the first and second insulating regions comprises a chemical mechanical polish.

4. The method of claim 1 wherein the steps of forming a conductive source region, a conductive drain region, and a conductive gate body comprises forming a mesa of semiconductor material overlying the planar surface and further comprising forming sidewalls associated with the mesa.

5. The method of claim 1 wherein the step of forming a conductive source region, a conductive drain region, and a conductive gate body comprises non-selectively depositing epitaxial silicon overlying the planar surface.

6. The method of claim 1 wherein the step of forming a conductive gate body overlying the planar surface and spaced apart from the conductive source region and conductive drain region further comprises forming a gate insulating layer disposed between the conductive gate body and the planar surface.

7. A method of forming a transistor comprising the steps of:
   forming a first insulating region in the outer surface of a semiconductor body;
   forming a second insulating region in the outer surface of the semiconductor body and spaced apart from the first insulating region by a region of semiconductor material;
   forming a layer of silicon overlying the first and second insulating regions;
   planarizing the layer of semiconductor material to define a planar surface;
   forming a conductive source region in the layer of semiconductor material overlying the first insulating region;
   forming a conductive drain region in the layer of silicon overlying the second insulating region; and
   forming a conductive gate body overlying the planar surface and spaced apart from the conductive source region and the conductive drain region.

8. The method of claim 7 wherein the step of forming a first insulating region and the step of forming a second insulating region comprises a LOCOS process.

9. The method of claim 7, wherein the step of forming a layer of semiconductor material overlying the first and second insulating regions comprises non-selectively depositing epitaxial silicon.

10. The method of claim 7 and further comprising applying a second LOCOS process to isolate the transistor from adjacent semiconductor devices.

11. The method of claim 7 wherein the step of planarizing the layer of semiconductor material comprises a chemical mechanical polish.

12. The method of claim 7 wherein the source region and the drain region are separated by a first distance and the step of forming a conductive gate body overlying the planar surface and spaced apart from the conductive source region and the conductive drain region comprises forming a conductive gate body extending the length of the first distance between the source region and the drain region.

* * * * *